United States Patent
Dansky et al.

(10) Patent No.: US 6,546,529 B1
(45) Date of Patent: Apr. 8, 2003

(54) METHOD FOR PERFORMING COUPLING ANALYSIS

(75) Inventors: Allan H. Dansky, Poughkeepsie, NY (US); Michael A. Bowen, Poughkeepsie, NY (US); Peter J. Camporese, Hopewell Junction, NY (US); Alina Deutsch, Chappaqua, NY (US); Howard H. Smith, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 09/677,362

(22) Filed: Oct. 2, 2000

(51) Int. Cl.7 .................................................. G06F 9/45
(52) U.S. Cl. ..................... 716/5; 716/4; 716/6
(58) Field of Search ...................... 716/4–6, 8, 10–12; 703/14, 15

(56) References Cited

U.S. PATENT DOCUMENTS 5,481,695 A * 1/1996 Purks ........................... 703/15
6,028,989 A * 2/2000 Dansky et al. ................. 716/8

* cited by examiner

*Primary Examiner*—Vuthe Siek
*Assistant Examiner*—Naum Levin
(74) *Attorney, Agent, or Firm*—Lynn Augspurger; Cantor Colburn LLP

(57) ABSTRACT

Deterministic evaluation of coupling noise voltage is a function of many physical and electrical parameters such as wiring level, widths, spacing, net topologies, drv impedance and slew rates. This evaluation requires electrical modeling and subsequent circuit simulation to assess the sensitivities of these parameters. These sensitivities can be categorized as coupling guidelines that can be directly linked through extracted physical design data. This invention discloses the development and implementation of a technique for using a coupling guideline table early in the design of an integrated circuit when all the parameters generally required for coupling noise voltage calculations are not available. The steps include: creating a flat wire routing map of the integrated circuit, identifying the coupled wire segments on the integrated circuit, tracking wire interconnection patterns on the integrated circuit, deriving electrical parameters for the coupled wire segments, and generating a coupling guideline table with parameters for a plurality of electrical parameters. The parameters in the coupling guideline table are applied to the derived electrical parameters and a report is generated that lists the derived electrical parameters that fail to comply with the parameters in the coupling guideline table.

8 Claims, 3 Drawing Sheets

METHOD FOR PERFORMING COUPLING ANALYSIS

BACKGROUND OF THE INVENTION

The invention is related to signal coupling between wires used on very large scale integration (VLSI) integrated circuit chips. These wires exist on the metal levels above the silicon and are used to connect the devices. There are millions of wires on these integrated circuits. An emerging problem in high performance VLSI digital circuit implementation is maintaining electrical signal integrity on long interconnect nets. Electrical noise can be injected on the interconnect nets and the circuits receiving the signals from several sources. These sources include, but are not limited to: mutual capacitances between the net and its neighbors, mutual inductances between the net and its neighbors, power supply voltage drops at the receiving circuit due to power supply distribution resistance (DC supply noise), and power supply voltage drops at the receiving circuit due to the instantaneous response of the power distribution to changes in the current demand of switching circuits (AC supply noise). These noise sources can superimpose at a specific physical instance and at specific points in time to cause substantial effects on the operation of the digital circuits. These effects can include, but are not limited to: the event of a false switching circuit due to excessive noise at the circuit input, the injection of additional delay to the propagation of the electrical signal along the interconnect, and the injection of additional delay in the operation of the receiving circuit due to a degraded supply voltage or a degraded signal transition rate at the circuit input. The effects of these noise sources on the circuit operation must be accounted for during the design development phase.

During the design development phase preventive measures and compensations must be included to insure that proper operation and expected performance are achieved. To accurately account for the noise sources, all the parameters which influence these effects must be known and quantifiable. These parameters include but are not limited to: the physical geometries of the metal interconnect, the resistance, capacitance and inductance of the interconnect, the signal timing characteristics including switching event time relative to other switching events on the integrated circuit, the signal slew rates, and the receiving circuit noise tolerance.

A difficulty, in practice, is that not all of the parameters are known when the implementation of the nets and circuits is conducted. Another difficulty arises when a hierarchical design methodology is employed for the design development since the modeling of the noise sources and its effects must be considered across the design hierarchies.

BRIEF SUMMARY OF THE INVENTION

Deterministic evaluation of coupling noise voltage is a function of many physical and electrical parameters such as wiring level, widths, spacing, net topologies, drv impedance and slew rates. This evaluation requires electrical modeling and subsequent circuit simulation to assess the sensitivities of these parameters. These sensitivities can be categorized as coupling guidelines that can be directly linked through extracted physical design data. This invention discloses the development and implementation of a technique for using a coupling guideline table early in the design of an integrated circuit when all the parameters generally required for coupling noise voltage calculations are not available. The steps include: creating a flat wire routing map of the integrated circuit, identifying the coupled wire segments on the integrated circuit, tracking wire interconnection patterns on the integrated circuit, deriving electrical parameters for the coupled wire segments, and generating a coupling guideline table with parameters for a plurality of electrical parameters. The parameters in the coupling guideline table are applied to the derived electrical parameters and a report is generated that lists the derived electrical parameters that fail to comply with the parameters in the coupling guideline table.

BRIEF DESCRIPTION OF THE DRAWINGS

Referring now to the drawings wherein like elements are numbered alike in the several FIGURES.

DETAILED DESCRIPTION OF THE PREFERRED EMBODIMENTS

Figure 1:
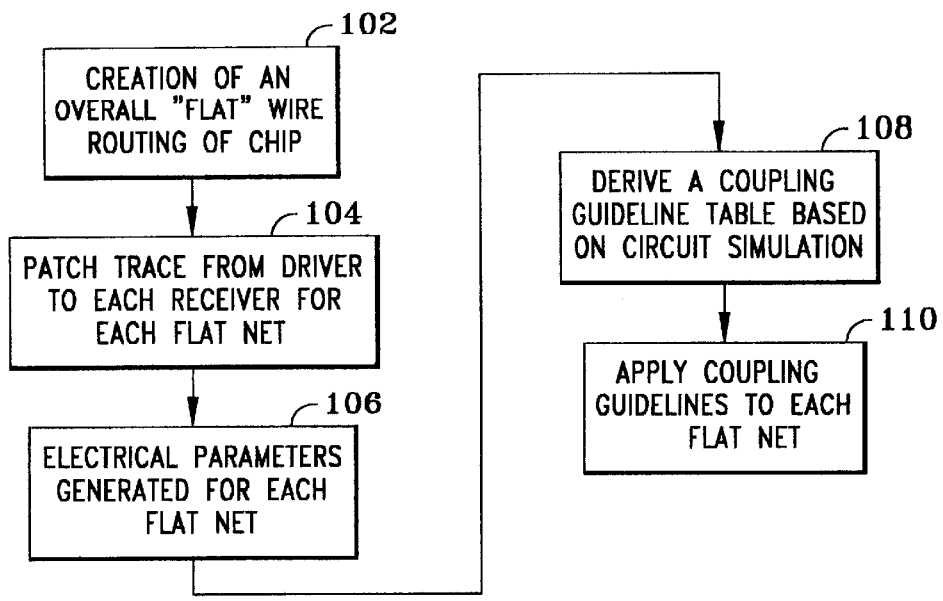
FIG. 1 depicts the overall flow of an example embodiment of the invention.

The invention includes a technique for applying coupling guidelines early in the design of a integrated circuit even when all the parameters generally required for coupling noise voltage calculations are not available. The invention comprises several steps in order to determine which nets are in violation of the coupling guidelines. FIG. 1 depicts the overall flow of an exemplary process. At step 102, an overall "flat" wire routing and crosstalk report is generated by flattening the hierarchy used to allow the units to be designed independently. Once the flat wire routing is complete, flow proceeds to step 104 where topological path tracing is performed through complex wire interconnection patterns for each flat net from a driver (source) to each receiver. At step 106, the electrical parameters for each net are generated using the data from steps 102 and 104. At step 108, a coupling guidelines table is generated based on circuit simulations and at step 110 the coupling guidelines table is applied to each "flat" net using the data from steps 108 and 106. Steps 106 and 108 need not be performed sequentially but rather may be performed in parallel with the results used at step 110.

Figure 2:
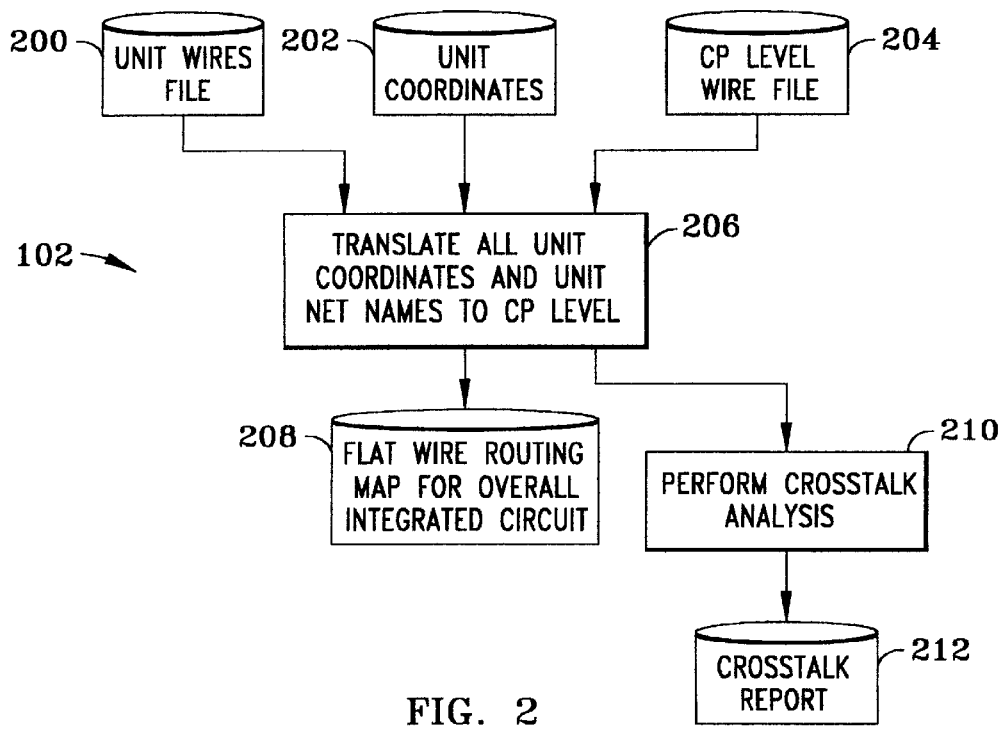
FIG. 2 depicts the creation of the overall "flat" wire routing and crosstalk report of a integrated circuit.

FIG. 2 depicts a sample embodiment of step 102, the creation of an overall "flat" wire routing 208 by flattening the hierarchy used to allow the units to be designed independently. The integrated circuit is designed hierarchically as separate large functions called units. Each unit is wired independently and the units pins are wired in a top view called CP level 204. Therefore, a complete electrical net can be comprised of several separately wired segments. For example, a net can be comprised of four segments consisting of one wire segment in each of three units, and a fourth segment interconnecting the three unit segments. In order to analyze the coupling on a net basis, the net wire segments must be stitched together from the four different design databases (3 units +1 CP level).

Since the integrated circuit (CP level) top level and each subsection (unit) are designed independently, the individual data files including a unit wires file 200, unit coordinates 202 and CP level wire file 204, have to be restructured into one "flat" data file 208, this procedure is referred to as creating an overall "flat" wire routing. As depicted in step 206, the unit level coordinates and net names are translated to integrated circuit, or CP, level coordinates. The unit coordinates 202 are translated based on the placement and orientation of the unit at the top level (CP level). Orientation refers to mirroring and/or rotation of the unit. The net names of nets which leave the unit must assume the CP level net name rather than the unit level net name. A net which leaves the unit passes through a unit level top level pin.

Crosstalk analysis is performed, step 210, and a crosstalk report 212 is created based on predefined rules. The crosstalk report 212 lists the coupling between horizontally and vertically adjacent wire segments. The wire segment net names, metal levels, and xy locations are contained in the report and will be used as a search link to the routing data and path tracing data (described later in the disclosure) to determine the relative locations of the coupled segments within the entire net routing in step 106, as shown in FIG. 1.

The path tracing routine, step 104 in FIG. 1, is used to determine the signal direction in each segment of a net's path and the order of segments to traverse to get from the source to each sink. Path tracing is performed for each net on the integrated circuit and the output of path tracing contains two types of information: the flat wire routing with signal propagation added and path tracing "string sequences." The inputs to path tracing include a listing, for every pin of each net on the integrated circuit, of the shapes associated with the pin and the type of pin being described (input or output) along with a session file that lists, for every net on the chip, each shape that is a part of the wiring for this net from the outputs of step 102.

A net must have at least one source and one sink to be traced, if a net has multiple sinks then the path tracing routine will return a path for each sink of the net, and the direction of travel through each segment. A path shows each segment of wire that must be traversed to reach the sink. A summary file is generated to indicate how well the tracing was able to run and this summary indicates the number of sinks on a net (the number of expected paths) and the number of actual paths generated. If the number of paths generated is less than the expected number of paths, a possible explanation for the missing paths is given.

An example embodiment of the path tracing algorithm, step 104, makes use of a geometry subroutine and database. This geometry database is used to store a set of shapes. Queries are made against the geometry subroutine to determine relationships between the shapes in the database and a given shape. This subroutine is used to quickly find other shapes that intersect a given shape. The geometry subroutine performs quick relationship queries through the manner in which it stores data on the geometry database. The given space is broken into a grid. Each tile of the grid contains three lists: short, medium, and long. Each lists contains a list of the shapes that fit the following criteria for the tile the list is in:

Short—shapes that are completely contained in the given tile;

Medium—shapes that span the given tile and one or more of the three tiles to north, east, and northeast; and Long—any remaining shape that begins in this tile and extends to the northeast further than one tile.

When the tile sizes are set appropriately the short list is the largest of these lists. When a query is made, the short, medium and long lists must be checked for any tile the shape being queried is in, but only the medium and long lists of the tiles to the southwest, and only the long lists of the tiles more than one tile away to the southwest.

Figure 3:
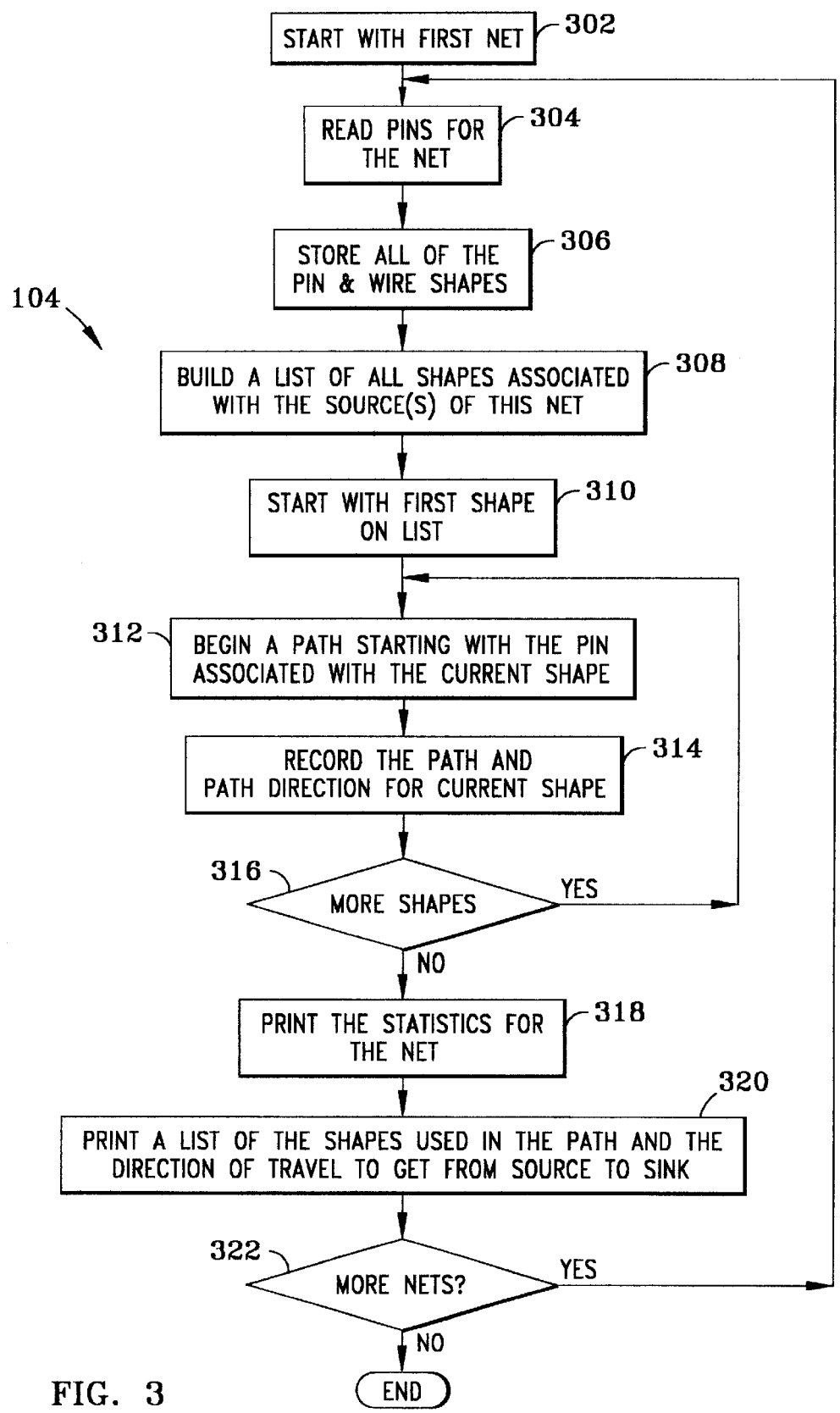
FIG. 3 depicts the tracing of a path from the driver to each receiver for each flat net.

FIG. 3 depicts an example embodiment of the path tracing routine implemented at step 104. The routine is performed for each net on the integrated circuit, starting with the first net, as shown by steps 302 and 322. The pins for the net are read at step 304. If the net has at least one source and sink then the process continues. All of the pin shapes and wire shapes for the net are stored in the geometry database at step 306. Then, a last in first out (LIFO) list that contains all the shapes associated with the source(s) of this net is built as shown in step 308. For each shape on the list, as depicted by steps 310 and 316, a path starting with the pin name associated with this shape is started at step 312 and path direction for any path from this shape is recorded at step 314.

Figure 4:
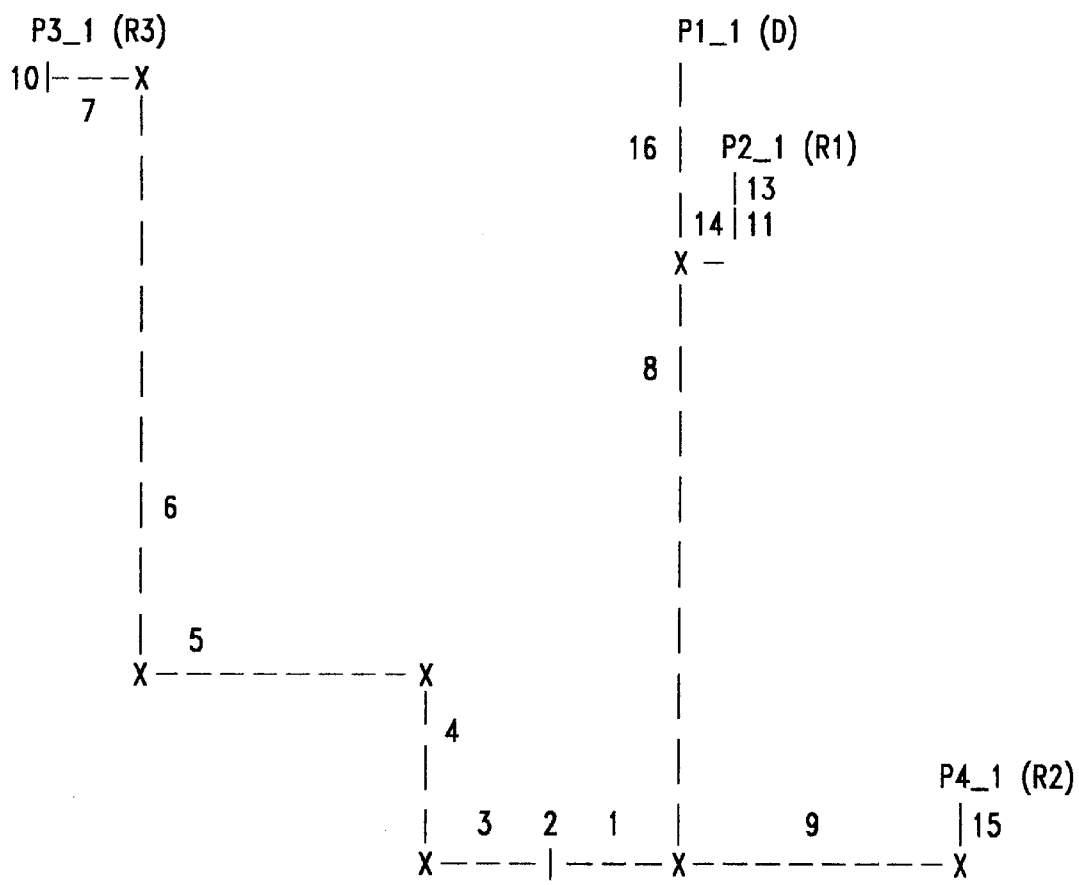
FIG. 4 depicts an exemplary net.

The direction of the path is determined at step 314 by first defining the end of a wire. A wire is generally rectangular, so the smaller width of the wire can be used to determine if this is a horizontal or vertical segment. In cases where this does not work (a square piece of wire) the predominant wiring direction for the level of the shape is used. Given the horizontal or vertical nature of the wire, it must be defined if the signal is moving to the left/right or up/down respectively. This can be done by determining which end of the wire is attached to the shape queried with and then determining if the other end of the shape is higher or lower than the attached shape. FIG. 4 depicts an exemplary net. The path tracing process for the layout of FIG. 4 is provided below in Table A.

TABLE A

Add all the pin and wire shapes to the geometry database
Add P1_1 to the visited List.
Call trace with the P1_1 shape and path "P1_1"
Query all shapes attached to P1_1 (returns 16)
Call trace with the 16 shape and path (P1_1 16)
Query all shapes attached to 16 (returns P1_1 14 8)
P1_1 has already been visited
Call trace with the 14 shape and path (P1_1 16 14)
Query all shapes attached to 14 (returns 16 11)
16 has already been visited
Call trace with the 11 shape and path (P1_1 16 14 11)
Query all shapes attached to 11 (returns 14 13)
14 has already been visited
Call trace with the 13 shape and path (P1_1 16 14 11 13)
Query all shapes attached to 13 (return 11 P2_1 )
11 has already been visited
P2_1 is a pin. Output path. (P1_1 16 14 11 13 P2_1)
Call trace with P2_1 and path P1_1 16 14 11 13 P2_1)
Query all shapes attached to P2_1 (return 13)
13 has already been visited
No more shapes
No more shapes
No more shapes
No more shapes
Call trace with the 8 shape and path (P1_1 16 8)
Query all shapes attached to 8 (returns 16 1 9)
16 has already been visited
Call trace with the 1 shape and path (P1_1 16 8 1)
Query all shapes attached to 1 (return 8 2)

As shown in FIG. 3, the statistics for the net are outputted at step 318, along with a list of the shapes used in the path, and the direction of travel on the shape to get from the source to the sink as shown at step 320. These processes, steps 304 through 320, are repeated for each net on the integrated circuit through step 322. Provided below in Table B is an exemplary output of the path tracing process.

TABLE B

"|bce|dc|m|c2_cyc_aa(42)"
FINAL SEQUENCES = (i values) = P1_1 16 14 11 13 P2_1
FINAL SEQUENCES = (i values) = P1_1 16 8 9 15 P4_1
FINAL SEQUENCES = (i values) = P1_1 16 8 1 2 3 4 5 6 7 10 P3_1
i = 1 (wire (path m3 180 2286050 1146125 2346075 1146125 )) xHL
i = 2 (wire (path m3 180 2286050 1146125 2286050 1147115 )) yLH
i = 3 (wire (path m3 180 2163285 1147115 2286050 1147115 )) xHL
i = 4 (wire (path m4 180 2163285 1147115 2163285 1214255 )) yLH
i = 5 (wire (path m3 180 1957365 1214255 2163285 1214255 )) xHL
i = 6 (wire (path m4 180 1957365 1214255 1957365 1456715 )) yLH
i = 7 (wire (path m3 180 1924560 1456715 1957365 1456715 )) xHL
i = 8 (wire (path m4 180 2346075 1135415 2346075 1410055 )) yHL
i = 9 (wire (path m3 180 2346075 1135415 2609325 1135415 )) xLH
i = 10 (wire (path m2 180 1924560 1456715 1924560 1462520 )) yLH
i = 11 (wire (path m2 180 2358495 1410055 2358495 1413245 )) yLH
i = 12 (wire (path m2 180 2358490 1413245 2358495 1413245 )) xHL
i = 13 (wire (path m2 180 2358490 1413245 2358490 1414640 )) yLH
i = 14 (wire (path m3 180 2342205 1410055 2358495 1410055 )) xLH
i = 15 (wire (path m4 180 2609325 1135415 2609325 1148755 )) yLH
i = 16 (wire (path m4 180 2342205 1410055 2342205 1453475 )) yHL
i = 17 (wire (path v3 2163285 1147115 2163285 1147115 )) VIA
i = 18 (wire (path v3 2163285 1214255 2163285 1214255 )) VIA
i = 19 (wire (path v3 1957365 1214255 1957365 1214255 )) VIA
i = 20 (wire (path v3 1957365 1456715 1957365 1456715 )) VIA
i = 21 (wire (path v3 2346075 1146125 2346075 1146125 )) VIA
i = 22 (wire (path v3 2346075 1135415 2346075 1135415 )) VIA
i = 23 (wire (path v2 1924560 1456715 1924560 1456715 )) VIA
i = 24 (wire (path v2 2358495 1410055 2358495 1410055 )) VIA
i = 25 (wire (path v3 2609325 1135415 2609325 1135415 )) VIA
i = 26 (wire (path v3 2346075 1410055 2346075 1410055 )) VIA
i = 27 (wire (path v3 2342205 1410055 2342205 1410055 )) VIA
i = 28 (wire (path v1 1924560 1462520 1924560 1462520 )) VIA
i = 29 (wire (path v1 2358490 1414640 2358490 1414640 )) VIA
i = 30 (wire (path v3 2609325 1148755 2609325 1148755 )) VIA
i = 31 (wire (path v3 2342205 1453475 2342205 1453475 )) VIA
i = P1_1 (wire (path m3 90 2341845 1453430 2344275 1453520 )) xLH
i = P2_1 (wire (path m1 180 2357325 1414550 2359035 1414730 )) xHL
i = P3_1 (wire (path m1 180 1923885 1462430 1925595 1462610 )) xLH
i = P4_1 (wire (path m3 90 2608965 1148710 2611395 1148800 )) xLH Step 106 in FIG. 1 is the generation of electrical parameters for each flat net to apply to the coupling guidelines table. The inputs to this step include the path tracing file from step 104 and the crosstalk report file 212. Several of these coupling parameters are already contained in the crosstalk report. Physical coupling parameters contained in the crosstalk report include metal levels of each coupled segment, coupled length, spacing (gap) between coupled segments, and xy locations of segment end points. The other coupling guideline parameter contained in the crosstalk report is the logical parameter net names. The coupling guideline parameters segment width (physical), location of coupled segments relative to driver (provides signal travel direction and is physical), and wire resistance from driver to coupled segments (electrical) are generated in step 106. In order to calculate the location of coupled segments relative to the driver and wire resistance from driver to coupled segments, a complete path trace has to be performed on each net. A path trace means that the ordering of every wire segment on a net is known from the driver to each wire segment. The ordering is important in order to keep track of signal propagation direction on each segment. For vertical segments the signal is traveling up or down. For horizontal segments the signal is traveling left or right. The path trace segment order is also used to calculate the wiring resistance from the driver to the coupled segment. A sample embodiment of this procedure of generating these three parameters: coupling guideline parameters segment width, location of coupled segments relative to driver, and wire resistance from driver to coupled segments in step 106 follows:

```
for each victim net (loop 1)
   for each coupling interaction (loop 2)
      for each wire segment in victim net (loop 3)
         determine if xy end points of wire segment exactly match xy
         endpoints from crosstalk rpt
            (segment index number now determined which also indexes
            the signal propagation direction for victim segment)
            for each segment index number in path trace sequence list
            (loop 4)
               (path from driver to coupled segment index number
               is now determined so wire resistance from
               driver to coupled segment can be calculated)
            for each wire segment in perp net (loop 3)
               determine if xy end points of wire
               segment exactly match xy endpoints from crosstalk rpt
               (segment index number now determined which also
               indexes the signal propagation direction
               for perp segment)
```

Table C below depicts a sample output from this step using the example of one victim net with seven perpetrator coupling interactions (perpetrators or "perps" induce crosstalk on victims).

TABLE C

Abbreviations:

| | |
|---|---|
| suffix of _v | refers to victim net |
| suffix of _p | refers to perp net |
| lev | metal level of wire segment |
| w | width of wire segment in um |
| gap | spacing between vict and perp nets in um |
| VN | victim net name |
| PN | perp net name |
| Lcoup | coupled wire length in um |
| VR | wire resistance from driver to coupled wire segment |

VICT_NET=|eu|fpu|ctl|cpx_xcm_align_over lev_v lev_p w_v w_p gap
CG-LINE1: VN: |eu|fpu|ctl|align_over P#=1 PN: |eu|fpu|ctl|xa_fbit0 m4 m4 0.9 0.9 0.900 yHL Lcoup=2.2248
CG-LINE2: VN: |eu|fpu|ctl|align_over P#=1 PN: |eu|fpu|ctl|xa_fbit0 yHL VR=7.8585
CG-LINE1: VN: |eu|fpu|ctl|align_over P#=2 PN: "|eu|fpu|ctl|sel_b_mux(8)" m4 m4 0.9 0.9 0.900 yHL Lcoup=0.24795
CG-LINE2: VN: |eu|fpu|ctl|align_over P#=2 PN: "|eu|fpu|ctl|sel_b_mux(8)" yHL VR=148.744
CG-LINE1: VN: |eu|fpu|ctl|align_over P#=3 PN: "|eu|fpu|ctl|sel_b_mux(0)" m4 m4 0.9 0.9 0.900 yHL Lcoup=0.16695
CG-LINE2: VN: |eu|fpu|ctl|align_over P#=3 PN: "|eu|fpu|ctl|sel_b_mux(0)" yHL VR=148.744
CG-LINE1: VN: |eu|fpu|ctl|align_over P#=4 PN: "|eu|fpu|ctl|sel_b_mux(8)" m3 m3 0.9 0.9 0.900 xHL Lcoup=0.1233
CG-LINE2: VN: |eu|fpu|ctl|align_over P#=4 PN: "|eu|fpu|ctl|sel_b_mux(8)" xHL VR=141.292
CG-LINE1: VN: |eu|fpu|ctl|align_over P#=5 PN: |eu|fpu|ctl|xa_fbit0 m3 m3 0.9 0.9 0.900 xLH Lcoup=0.1089
CG-LINE2: VN: |eu|fpu|ctl|align_over P#=5 PN: |eu|fpu|ctl|xa_fbit0 xLH VR=1.2705
CG-LINE1: VN: |eu|fpu|ctl|align_over P#=6 PN: "|eu|fpu|ctl|xcm_swap_over(1)" m3 m3 0.9 0.9 1.800 xHL Lcoup=0.1125
CG-LINE2: VN: |eu|fpu|ctl|align_over P#=6 PN: "|eu|fpu|ctl|xcm_swap_over(1)" xHL VR=141.292

CG-LINE1: VN: |eu|fpu|ctl|align_over P#=7 PN: "|eu|fpu_ trace_din(16)" m4 m4 0.9 1.8 4.050 yHL Lcoup=0.20235
CG-LINE2: VN: |eu|fpu|ctl|align_over P#=7 PN: "|eu|fpu_ trace_din(16)" yLH VR=10.2705

Referring to Table C, the top of the output contains some definitions of the fields. Each victim net has a line starting with VICT_NET=, and then there are 2 lines (CG-LINE1 and CG-LINE2) for each perp coupling to that victim net. For this victim net, there are 7 perps coupling to this victim net. Note that P#'s 2 and 4 have the same net name and so do P#'s 1 and 5. CG-LINE1 contains the physical parameters, namely lev_v lev_p w_v w_p gap which are explained in the definition lines. The next entry on this line is the character string yHL for the victim net which stands for vertical (y axis) followed by HL which stands for High to Low. This means the signal travels from the High y value to the Low y value. So, if the origin (0,0) of the integrated circuit is the lower left corner, then the signal is traveling Down (High y to Low y) the Vertical wire segment. The line "CG-LINE1" contains the signal propagation direction for the victim net, and the line "CG-LINE2" contains the signal propagation direction for the perp net. The relative direction is used as an input parameter to the Coupling Guideline Table which will be described later. The definitions of "same" or "opposite" direction for the victim signal flow relative to the perp signal flow is specified in the e below:

| victim | HL | LH | HL | LH |
|---|---|---|---|---|
| perp | HL | LH | LH | HL |
| direction | same | same | opposite | opposite |

The sample output in Table C lists all the physical and electrical parameters necessary to apply the coupling guideline table to each victim net. The coupling guideline table is generated using standard circuit simulation approaches (e.g., SPICE, ASX, etc.) in conjunction with electrical models that represent the represent the propagation and noise characteristics of the prescribed wiring topologies. These wire models are characterized using field solver tools to compute the per unit length capacitance, resistance and inductance matrices that will be compatible for subsequent circuit simulations. In some case circuit synthesis approaches are used to represent return path impact to the wiring geometries under evaluation.

Point to point nets representation of both the far end (FE) or near end (NE) topologies are constructed. Both uncoupled sections and the coupled sections are varied in the circuit simulator for each wiring geometry represented by the coupled RLC circuit that is a function of wiring level, width and gap parameters. Coupled length limits are extracted from the simulation results to contain the induced noise levels within a predetermined noise limit for the chip design point The coupling guideline table defines the allowed coupling distance for a given perp/victim interaction based on factors such as wire level, wire width, space between wires, and same or opposite direction. The table values will be specific to the metallurgy and the environment and therefore will differ between CMOS processes. For a given level, wire width and wire spacing six values are specified. They are broken into two groups of three based on whether the perp and victim signals are traveling in opposite directions or not. The numbers in a group represent different wiring resistance from the victim driver to the coupled segments and the table tells you the maximum number of millimeters of parallelism. A sample embodiment of a coupling guidelines table follows:

| | | | FE Topology net resistance | | | NE Topology net resistance | | |
|---|---|---|---|---|---|---|---|---|
| Level | Width | Gap | 0 ohms Lc1 | 100 ohms Lc2 | 200 ohms Lc3 | 0 ohms Lc4 | 100 ohms Lc5 | 200 ohms Lc6 |
| M4 | 1.8 | 1.8 | a | b | c | d | e | f |
| M4 | 1.8 | 3.6 | g | h | i | j | k | l |

A key attribute of the coupling guideline table is the characterization of the net topology. There can be an 8x error in the coupling noise prediction if net topology is accounted for in some fashion. The primary mechanism driving this error is the equivalent resistance to ground on the victim net as well as the relative signal direction of perp/victim interaction. These effects are accounted for in the coupling guideline table as a computed resistance from driver output to coupling section for both near end and far end topologies.

The accuracy of the coupling guideline table is very much a function of the electrical model/technique used. In this case frequency dependent RLC models were used for coupling interactions on M5, MQ and LM, while RC models sufficed for lower level rule generation. This approach allows accuracy to be maintained across all levels of the BEOL characterization.

The coupling guidelines are applied by a program, as shown in step 110 of FIG. 1, that reads coupling information for a net, interpolates between points in the guideline table and reports the results for each net. A net will be flagged as potentially having noise problems if either: two nets are found to be coupled for a longer distance than allowed by the table, or if the sum of the max allowed distances for all perps is exceeded by the sum of the actual coupled distances of the perps. An error is generated if multiple perps are found to be over the given limit defined in the chart. In general, a single perp over the limit will not cause an error. The exception to this rule is when a single perp significantly exceeds the limit. In order to catch this case, the sum of all perp limits is compared to the sum of all the actual coupled distances and if the actual is greater an error is reported.

Failure criteria for each net is based on containing the coupling noise below a certain noise budget which equates to maintaining the maximum allowable coupled length below certain length limits. In most cases it takes at least 2 perp nets to achieve this limit. However, the wiring is such that there can be many perp nets. Table D below presents a partial output of report data after application of coupling guidelines in step 110 based on the coupling guideline table.

TABLE D

Abbreviations:

coupL = actual coupled wire length in um
Max = maximum allowed coupled length from Guideline Table
*** violation, since the actual exceeds the maximum for that perp
Perp = the number of perp couplings with the same perp name
Vict ="|ib__iu__target(47)"
    coupL = 0.3124 Max = 3.0703 1 Perp = "|iu|d__or__i(15)"
    coupL = 0.3186 Max = 2.9167 1 Perp = "|iu__ib__data__in(47)"
    coupL = 8.5293 Max = 10.1125 2 Perp = "|ib__iu__target(46)"
Sum MAX 9.62205 Sum Act 9.1603
Vict = "|em__bu__c__bus(29)"
    coupL = 0.1587 Max = 5.72242 1 Perp = |im__bu__rescind__c2
    *** coupL = 15.527 Max = 15.2148 4 Perp = "|em__bu__c__bus(28)"
    coupL = 0.27055 Max = 3.96735 1 Perp = "|im__bu__prab(56)"
    coupL = 0.25705 Max = 4.6251 1 Perp = "|em__bu__c__bus(27)"
    Sum MAX 14.7663 Sum Act 16.2133
Vict = "|em__du__byte__marks(5)"
Failed TOO__MANY__PERPS__OVER__LIMIT 2
    coupL = 0.11525 Max = 2.20391
    1 Perp = "|du__dcac__odd__dwd__mirr(44)"
    *** coupL = 6.06195 Max = 5.7231
    2 Perp = "|em__du__byte__marks(6)"
    coupL = 0.50135 Max = 2.86892 1 Perp = "|bce|dc|fuse__ro(81)"
    *** coupL = 6.6348 Max = 5.72716
    3 Perp = "|em__du__byte__marks(4)"
    coupL = 0.2703 Max = 5.37338
    1 Perp = "|bce|12__du__rec__data__od__ro(60)"
    Sum MAXS 5.58292 Sum Act 13.5837

In most cases, timing orthogonality results in non overlapping of all these noise sources. This timing information becomes available very late in the design cycle. To circumvent this problem net name correlation is used to identify bits in the same bus to assess the probability of noise overlap of multiple perps.

The coupling guideline application uses a two step linear interpolation between values in the table for resistances and gaps. An example embodiment follows:

Four values are pulled from the table:

1-Entry in the table for a given level/width that has the largest defined gap smaller than the given gap, and the largest resistance smaller than the given resistance.

2-Entry in the table for a given level/width that has the largest defined gap smaller than the given gap, and the smallest resistance larger than the given resistance.

3-Entry in the table for a given level/width that has the smallest defined gap larger than the given gap, and the largest resistance smaller than the given resistance.

4-Entry in the table for a given level/width that has the smallest defined gap larger than the given gap, and the smallest resistance larger than the given resistance.

Then two additional values are generated:

5-Interpolate between values 1 and 3 using the given gap.

6-Interpolate between values 2 and 4 using the given gap.

Then to get the final value interpolate between values 5 and 6 using the given resistance.

Given the previous example coupling guideline table, a gap of 2.0 and a resistance of 75, The values would be generated as follows.

1—a, 2—b, 3—g, 4—h

5—$(g-a)*((2.0-1.8)/(3.6-1.8))+a$

6—$(h-b)*((2.0-1.8)/(3.6-1.8))+b$

MaxCoupDist=$(6-5)*((75-0)/(100-75))+5$;

In the sample output report in Table D, perps having an actual coupled length exceeding the Max allowed values are labeled with * * * In the sample listing 3 victim nets are shown. The first victim net has no * * * labeled perps, the second victim net has one, and the third victim net has 2 and therefore it fails the coupling guideline table and therefore must be fixed.

Along with the previously mentioned improvements, the disclosed invention allows improved path tracing by accounting for the direction of the victim and the perps when determining and applying the coup ling guidelines. This, along with the use of a table for coupling guidelines during the design of an integrated circuit, results in integrated circuits that are less likely to experience problems with electrical noise.

The present invention may be implemented in the form of computer-implemented processes and apparatuses for practicing those processes. The present invention can also include embodiments in the form of computer program code containing instructions embodied in tangible media, such as floppy diskettes, D-ROMs, hard drives, or any other computer-readable storage medium, wherein, when the computer program code is loaded into and executed by a processor, the processor becomes an apparatus for practicing the invention. The present invention can also include embodiments in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method for determining and applying coupling guidelines across design hierarchies in an integrated circuit designed using a hierarchical design process, the method comprising:

creating an overall flat wire routing map across design hierarchies of the integrated circuit designed using a hierarchical design process, wherein said integrated circuit includes a plurality of independently designed interconnected units;

identifying coupled wire segments on the integrated circuit;

tracing wire interconnection patterns on the integrated circuit from sources to receivers using said flat wire routing map;

deriving electrical parameters for said coupled wire segments using said flat wire routing map and said wire interconnection patterns;

generating a coupling guideline table containing coupling guideline parameters for a plurality of electrical parameters;

applying said coupling guideline parameters to said electrical parameters for said coupled wire segments; and generating report data of said electrical parameters for said coupled wire segments that fail to comply with said coupling guideline parameters.

2. The method as recited in claim 1 wherein said electrical parameters for said coupled wire segments include one of metal levels of each coupled segment, coupled length, spacing between coupled segments, xy locations of segment end point, logical parameter net names, segment width, location of coupled segments relative to driver, and wire resistance from driver to coupled segment.

3. The method as recited in claim 2 wherein said deriving of at least one electrical parameter for said coupled wire segments is performed using crosstalk analysis software.

4. The method as recited in claim 1 wherein said coupling guideline parameters comprise: wire level, wire width, space between wires, and same or opposite direction.

5. A storage medium encoded with machine-readable computer program code for determining and applying coupling guidelines across design hierarchies in an integrated circuit designed using a hierarchical design process, the storage medium including instructions for causing a computer to implement a method comprising:

creating an overall flat wire routing map across design hierarchies of the integrated circuit designed using a hierarchical design process, wherein said integrated circuit includes a plurality of independently designed interconnected units;

identifying coupled wire segments on the integrated circuit;

tracing wire interconnection patterns on the integrated circuit from sources to receivers using said flat wire routing map;

deriving electrical parameters for said coupled wire segments using said flat wire routing map and said wire interconnection patterns;

generating a coupling guideline table containing coupling guideline parameters for a plurality of electrical parameters;

applying said coupling guideline parameters for said coupled wire segments to said electrical parameters; and generating report data of said electrical parameters for said coupled wire segments that fail to comply with said coupling guideline parameters.

6. The storage medium as recited in claim 5 wherein said electrical parameters for said coupled wire segments include one of metal levels of each coupled segment, coupled length, spacing between coupled segments, xy locations of segment end point, logical parameter net names, segment width, location of coupled segments relative to driver, and wire resistance from driver to coupled segment.

7. The storage medium as recited in claim 6 wherein said deriving of at least one electrical parameter for said coupled wire segments is performed using crosstalk analysis software.

8. The storage medium as recited in claim 5 wherein said coupling guideline parameters comprise: wire level, wire width, space between wires, and same or opposite direction.

* * * * *